United States Patent
Noguchi et al.

(10) Patent No.: US 7,700,954 B2
(45) Date of Patent: Apr. 20, 2010

(54) TRANSISTOR, METHOD OF FABRICATING THE SAME AND ORGANIC LIGHT EMITTING DISPLAY INCLUDING THE TRANSISTOR

(75) Inventors: Takashi Noguchi, Yongin-si (KR); Jong-man Kim, Yongin-si (KR); Jang-yeon Kwon, Yongin-si (KR); Kyung-bae Park, Yongin-si (KR); Ji-sim Jung, Yongin-si (KR); Hyuck Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 594 days.

(21) Appl. No.: 11/621,627

(22) Filed: Jan. 10, 2007

(65) Prior Publication Data
US 2007/0262314 A1 Nov. 15, 2007

(30) Foreign Application Priority Data
Jan. 10, 2006 (KR) .................. 10-2006-0002687

(51) Int. Cl.
H01L 27/15 (2006.01)
H01L 29/26 (2006.01)
H01L 31/12 (2006.01)
H01L 33/00 (2010.01)

(52) U.S. Cl. ................ 257/79; 257/59; 257/207; 257/E21.212; 257/E21.213; 257/E21.154; 438/82; 438/99; 438/149; 438/455

(58) Field of Classification Search ................ 257/59, 257/79, 758, 207, 208, 211, E21.212, E21.213, 257/E21.151; 438/82, 99, 149, 455
See application file for complete search history.

(56) References Cited

U.S. PATENT DOCUMENTS

| 2006/0102067 A1* | 5/2006 | Noguchi et al. | ............... 117/84 |
| 2006/0145158 A1* | 7/2006 | Noguchi et al. | ............... 257/66 |
| 2006/0267017 A1* | 11/2006 | Noguchi et al. | ............... 257/66 |
| 2006/0270097 A1* | 11/2006 | Kim et al. | ..................... 438/82 |

FOREIGN PATENT DOCUMENTS

JP 2002-156923 5/2002

OTHER PUBLICATIONS

"Comparison of Different Techniques for Passivation of Small-Grain Polycrystalline-Si MOSFET's"; Authors: M. Rodder, et al., IEEE Electron Device Letters, vol. EDL-6, No. 11 (Nov. 1985).
"Anomalous Leakage Current in LPCVD Polysilicon MOSFET's"; Authors: Jerry G. Fossum, et al., IEEE Trans. Electron Devices, vol. ED-32, No. 9, pp. 1878-1884, ( Sep. 1985).

* cited by examiner

*Primary Examiner*—Zandra Smith
*Assistant Examiner*—Telly D Green
(74) *Attorney, Agent, or Firm*—Cantor Colburn LLP

(57) ABSTRACT

A transistor includes; at least two polycrystalline silicon layers disposed substantially parallel to each other, each polycrystalline silicon layer including a channel region and at least two high conductivity regions disposed at opposing sides of the channel region; a gate which corresponds to the channel region of the two polycrystalline silicon layers and which crosses the two polycrystalline silicon layers, and a gate insulating layer interposed between the gate and the two polycrystalline silicon layers, wherein low conductivity regions are disposed adjacent to one edge of the gate and are formed between the channel region and one high conductivity region of each polycrystalline silicon layer.

8 Claims, 9 Drawing Sheets

TRANSISTOR, METHOD OF FABRICATING THE SAME AND ORGANIC LIGHT EMITTING DISPLAY INCLUDING THE TRANSISTOR

This application claims priority to Korean Patent Application No. 10-2006-0002687, filed on Jan. 10, 2006, and all the benefits accruing therefrom under 35 U.S.C. §119, the contents of which in its entirety are herein incorporated by reference.

BACKGROUND OF THE INVENTION

1. Field of the Invention

The present invention relates to an organic light emitting display having a polycrystalline silicon thin film transistor ("TFT"), a method of fabricating the same, and an organic light emitting display including the transistor.

2. Description of the Related Art

Active color image display apparatuses using an organic light emitting diode ("OLED") generally use a circuit including two transistors and one capacitor. In particular the circuit includes a switching transistor (also known as a sampling transistor), which provides an analog image signal, a memory capacitor retaining an image signal and a driving transistor controlling a current supplied to an OLED according to an image signal voltage accumulated on the memory capacitor. This circuit has what is called a 2T-1C structure, wherein the "2T" stands for two transistors and the –"1C" represents one capacitor, and an example of such circuit construction is disclosed in Japanese Patent Laid-open Publication No. 2002-156923. A pixel including a 2T-1C structure can be constructed using a complementary metal-oxide-semiconductor ("CMOS") obtained from a wafer which comprises single crystalline silicon. However such a pixel cannot be easily constructed using a thin film transistor ("TFT") structure.

An n-channel polycrystalline silicon TFT is used in manufacturing an OLED on a glass or plastic substrate. The advantage of using polycrystalline silicon is that it is able to obtain very high charge carrier mobility compared to amorphous silicon. However, the disadvantage of using polycrystalline silicon is that it may have a high leakage current when turned off.

It is well known that, in such a polycrystalline silicon TFT, leakage of a current is generated in a depletion region of a drain by grain boundary traps (see Ferry G. Fossum, et al., IEEE Trans. Electron Devices, vol. ED-32, pp. 1878-1884, 1985).

In order to more effectively reduce current leakage, an offset structure has been proposed (see M. Rodder et al., IEEE Electron Device Letters, Vol. EDL-6, No. 11, November 1985). An offset region is located between a channel and a gate and another offset region is located between the channel and the drain. The use of offsets deteriorates an electric field generated at the drain and reduces field emission caused by a gate voltage and a drain voltage. However, in the prior art, a doping process which varies locally is required to form an offset structure. Unfortunately this locally varying doping process requires the use of an additional mask in order to manufacture the offset structure. In order to successfully perform differential doping in the offset region using the mask, the mask is required to be precisely aligned on a substrate. However, since the manufacturing method uses an additional mask, a doping process is complicated, yield is low and productivity is degraded.

Accordingly, a simplified method of manufacturing a transistor having an offset structure is required. In particular, the number of masks required for the formation of a lowly doped drain ("LDD") is required to be minimized.

BRIEF SUMMARY OF THE INVENTION

The present invention provides a thin film transistor ("TFT") having an offset structure a method of fabricating the same without the use of an additional mask.

An exemplary embodiment of a transistor according to the present invention includes; at least two polycrystalline silicon layers disposed substantially parallel to each other, each polycrystalline silicon layer including a channel region and at least two high conductivity regions disposed at opposing sides of the channel region, a gate which corresponds to the channel region of the two polycrystalline silicon layers and which crosses the two polycrystalline silicon layers, and a gate insulating layer interposed between the gate and the two polycrystalline silicon layers, wherein low conductivity regions are disposed adjacent to one edge of the gate and are formed between the channel region and one high conductivity region of each polycrystalline silicon layer.

In one exemplary embodiment impurities may be doped in the low conductivity regions with a lower concentration than in the high conductivity regions.

In another exemplary embodiment the at least two polycrystalline silicon layers may be formed as a unitary body.

In another exemplary embodiment the low conductivity regions are disposed substantially opposite one another with respect to an axis of symmetry of the transistor.

An exemplary embodiment of an organic light emitting display according to the present invention includes; a scan line disposed on a substrate; a data line disposed substantially perpendicular to the scan line; a switching transistor including a source electrode connected to the data line, a gate electrode connected to the scan line and a drain electrode, a driving transistor including a gate electrode connected to the drain electrode of the switching transistor, a source electrode connected to a voltage supply and a drain electrode, an organic light emitting diode ("OLED") including a first electrode connected to the drain electrode of the driving transistor and a second electrode connected to a common voltage, wherein the switching transistor includes; at least two polycrystalline silicon layers disposed substantially parallel to each other, each polycrystalline silicon layer including a channel region and at least two high conductivity regions disposed at opposing sides of the channel region, a gate which corresponds to the channel region of the two polycrystalline silicon layers and which crosses the two polycrystalline silicon layers, and a gate insulating layer interposed between the gate and the two polycrystalline silicon layers, wherein low conductivity regions are disposed adjacent to one edge of the gate and are formed between the channel region and one high conductivity region of each polycrystalline silicon layer.

An exemplary embodiment of a method of fabricating an exemplary embodiment of a transistor according to the present invention includes; forming at least two polycrystalline silicon layers disposed substantially parallel to each other and a third polycrystalline silicon layer which connects two ends of the polycrystalline silicon layers on a substrate, forming a gate insulating layer on the polycrystalline silicon layers;

forming a gate material layer on the gate insulating layer, forming a gate which crosses the at least two polycrystalline silicon layers by removing the gate material layer and the gate insulating layer in substantially the same pattern, and implanting impurities into both sides of the two polycrystalline silicon layers which are left uncovered by the gate, wherein a direction of the implanting impurities is performed at an angle to the substrate, which creates a shade region where the impurities do not directly reach the polycrystalline silicon layers.

In one exemplary embodiment the gate and one edge of the gate insulating layer block the implanting of impurities in the shade region during the implanting.

BRIEF DESCRIPTION OF THE DRAWINGS

The foregoing and other aspects, features, and advantages of the present invention will become more apparent by describing in detail exemplary embodiments thereof with reference to the attached drawings in which.

DETAILED DESCRIPTION OF THE INVENTION

Figure 1:
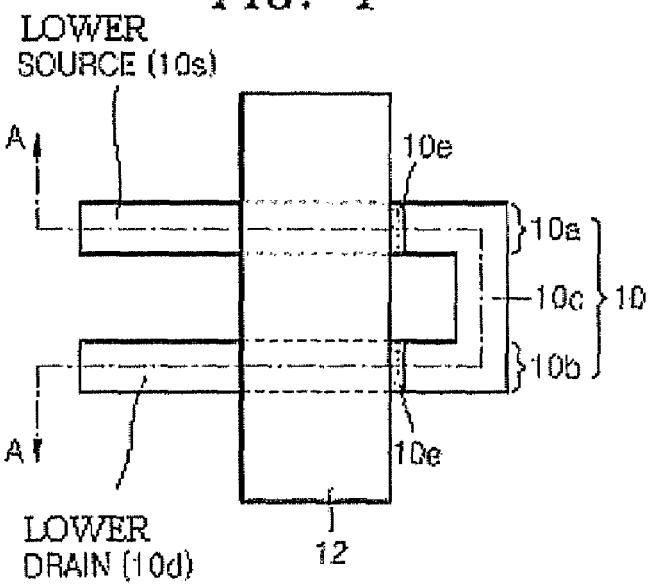
FIG. 1 is a schematic layout of an exemplary embodiment of a transistor according to the present invention.

The invention now will be described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on" another element or layer, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below" or "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Exemplary embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing.

For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Hereinafter, the present invention will be described in detail with reference to the accompanying drawings.

Figure 2:
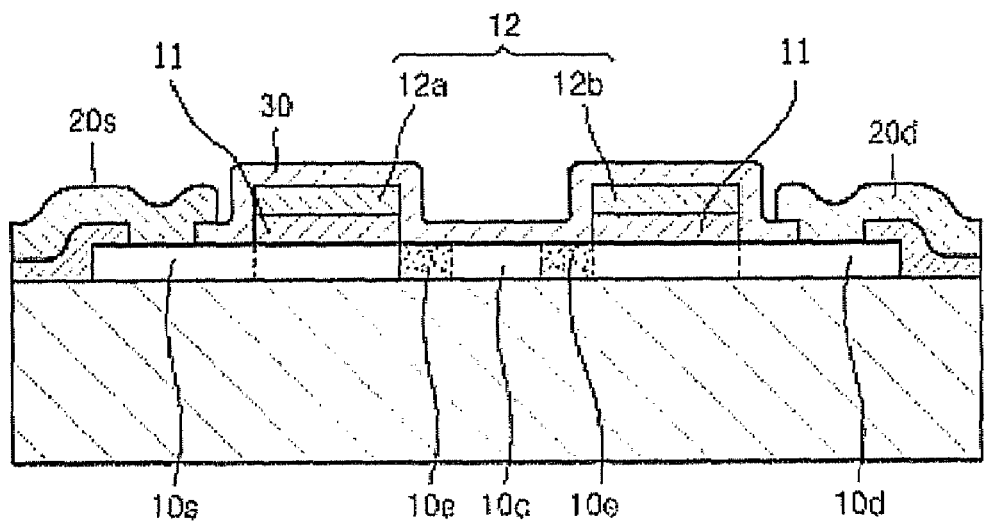
FIG. 2 is a cross-sectional view taken along line A-A of FIG. 1.
Figure 3:
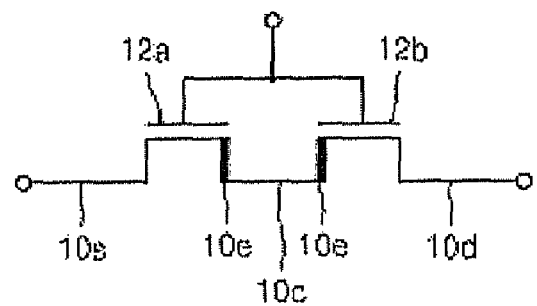
FIG. 3 is an equivalent circuit diagram of the exemplary embodiment of a transistor illustrated in FIGS. 1 and 2.

FIG. 1 is a schematic layout of an exemplary embodiment of a transistor according to the present invention, FIG. 2 is a cross-sectional view taken along line A-A of FIG. 1, and FIG. 3 is an equivalent circuit diagram of the exemplary embodiment of a transistor illustrated in FIGS. 1 and 2.

Referring to FIG. 1, two polycrystalline silicon layers 10a and 10b in which a lower source 10s and a lower drain 10d are respectively disposed, are disposed on a first end and a second end of the transistor, respectively. The first and second ends of the transistor are illustrated on the left side of FIG. 1. The two polycrystalline silicon layers 10a and 10b are disposed substantially parallel to each other. The first and the second ends of the transistor are connected to each other by a bridge 10c on the right side of FIG. 1. A gate 12 is disposed on the polycrystalline silicon layers 10a and 10b and extends in a direction substantially perpendicular to them. A gate insulating layer (see 11 of FIG. 2) having substantially the same pattern as that of the gate 12 is located under the gate 12. Meanwhile, low conductivity regions, e.g., regions of low charge carrier mobility, 10e of the polycrystalline silicon layers 10a and 10b are disposed adjacent to one edge of the gate 12. The low conductivity regions 10e are regions in which doping is performed with very low concentration, and are high resistance regions having a relatively high electrical resistance. The bridge 10c, located between the low conductivity regions 10e, is a high conductivity region, e.g. a region of high charge carrier mobility, doped with high concentration. An active layer 10 including the polycrystalline silicon has a sideways-laid U-shape in which the two polycrystalline silicon layers 10a and 10b disposed substantially parallel to each other and connected by the bridge 10c are disposed.

Referring to FIG. 2, the exemplary embodiment of a transistor according to the present invention has a shape similar to a dual gate transistor. That is, two unit gates 12a and 12b spaced apart from each other by a predetermined gap are disposed on the active layer 10. Again, the active layer 10 is active due to the two polycrystalline silicon layers 10a and 10b. The high conductivity bridge 10c and low conductivity regions 10e and 10e are disposed in a region between the two unit gates 12a and 12b. In FIG. 2, reference numerals 20s, and 20d, and 30 denote a source electrode, a drain electrode, and an interlayer dielectric ("ILD") layer, respectively.

FIG. 3 is an equivalent circuit diagram of the exemplary embodiment of a transistor illustrated in FIGS. 1 and 2.

Referring to FIG. 3, the shape of the exemplary embodiment of a transistor is similar to that of the dual gate transistor. However, the current exemplary embodiment of a transistor differs from the dual gate transistor in that the unit gates 12a and 12b are connected.

The exemplary embodiment of a transistor according to the present invention can enlarge the effective length of a channel in a restricted area and therefore, a leakage current is reduced or effectively prevented. In addition, charge carrier mobility is reduced by the two low conductivity regions 10e and 10e disposed between the two unit gates 12a and 12b so that a leakage current is further reduced or effectively prevented when the exemplary embodiment of a transistor is in an off-current state.

The exemplary embodiment of a transistor according to the present invention may be used as a switching transistor in an exemplary embodiment of an organic light emitting display wherein the exemplary embodiment of an organic light emitting display requires a switching transistor and/or a driving transistor. The exemplary embodiment of a transistor may also be used as a pixel switching element of an active matrix liquid crystal display.

An exemplary embodiment of an organic light emitting display including the exemplary embodiment of a transistor as a switching element according to the present invention will now be described with reference to FIGS. 4-8.

Figure 4:
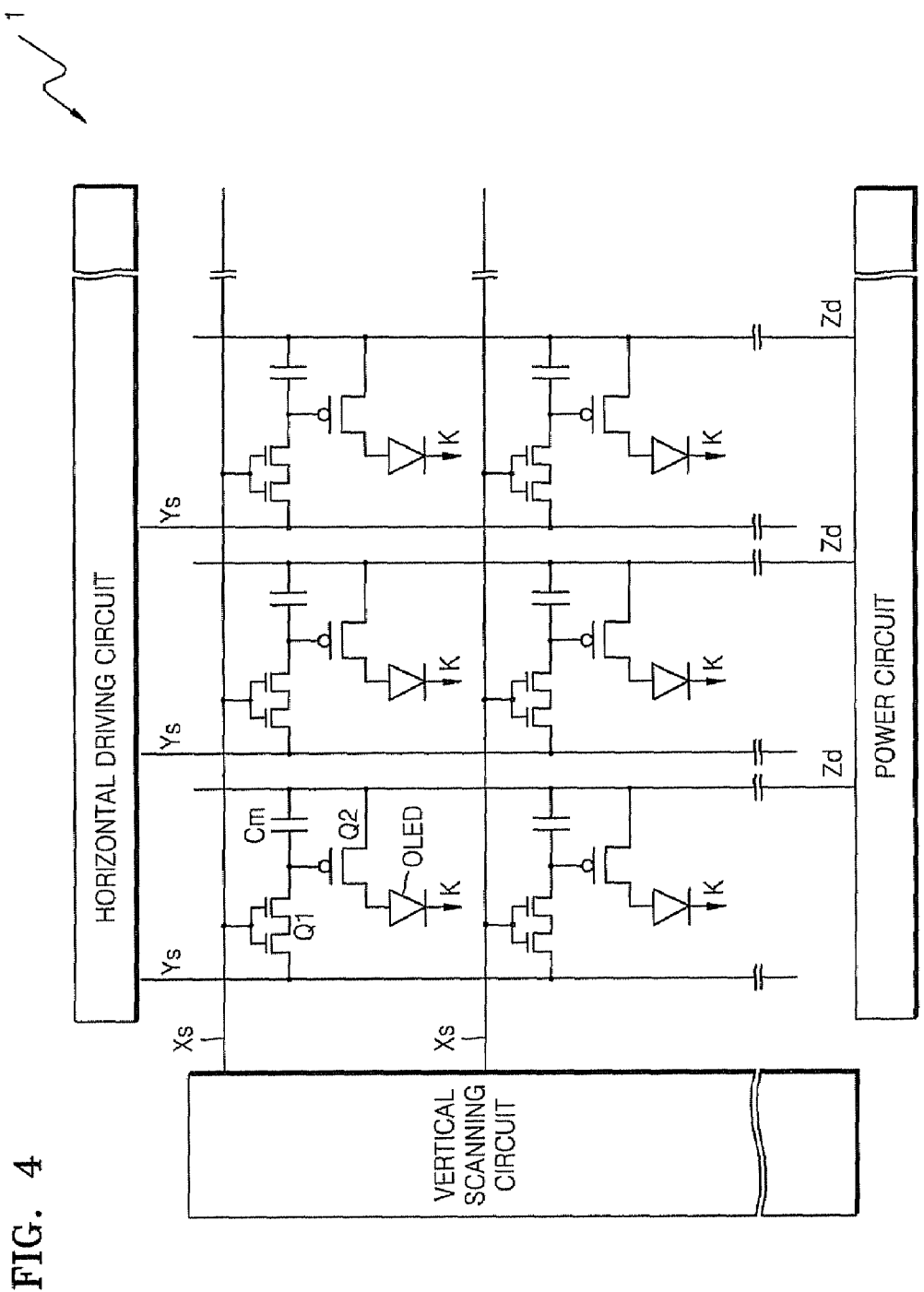
FIG. 4 is an equivalent circuit diagram of an exemplary embodiment of an organic light emitting display according to the present invention.
Figure 5:
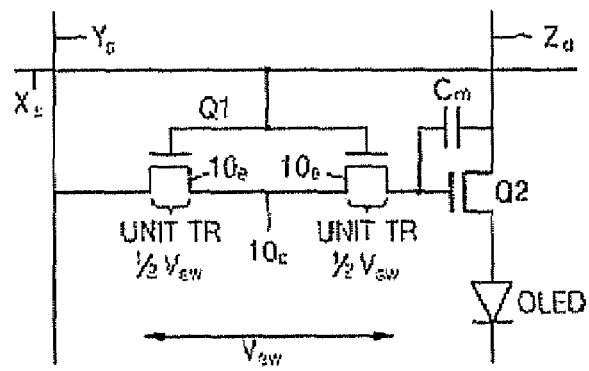
FIG. 5 is an equivalent circuit diagram of an exemplary embodiment of a unit pixel of the exemplary embodiment of an organic light emitting display illustrated in FIG. 4.

FIG. 4 is an equivalent circuit diagram illustrating an exemplary embodiment of an organic light emitting display according to the present invention, and FIG. 5 is an equivalent circuit diagram of an exemplary embodiment of a unit pixel of the exemplary embodiment of an organic light emitting display illustrated in FIG. 4.

An exemplary embodiment of a display device 1 includes a plurality of substantially parallel gate lines Xs and a plurality of substantially parallel data lines Ys which are disposed substantially perpendicular to the plurality of gate lines Xs. The exemplary embodiment of a display device 1 has a matrix structure, power supply lines Zd are disposed substantially parallel to the data lines Ys and are separated therefrom by a predetermined gap. A region encompassed by adjacent gate lines Xs and data lines Ys is also referred to as a pixel. As shown in FIG. 4 the exemplary embodiment of a display device 1 comprises a plurality of pixels.

Vertical scanning signals are applied to the gate lines Xs, and horizontal driving signals, which are also called image signals, are applied to the data lines Ys. The gate lines Xs are connected to a vertical scanning circuit, and the data lines Ys are connected to a horizontal driving circuit. The power supply lines Zd are connected to a power circuit for supplying a voltage to an organic light emitting diode ("OLED").

Each pixel includes two transistors Q1 and Q2 and one capacitor Cm. In each pixel, a gate of a switching transistor Q1 is connected to the gate line Xs and a source of the switching transistor is connected to the data lines Ys, and a drain of the switching transistor Q1 is connected to a gate of a driving transistor Q2. A memory capacitor Cm which accumulates applied charges applied by the switching transistor Q1 is connected in parallel to the gate and a source of the driving transistor Q2. An anode of the OLED is connected to a drain of the driving transistor Q2. And, a cathode K of the OLED corresponds to a common electrode shared by substantially all of the plurality of pixels. The cathode K supplies a common voltage to the plurality of pixels. In one exemplary embodiment the common voltage is a constant voltage. In one exemplary embodiment the common voltage is a ground voltage. In an exemplary embodiment wherein the display device is a liquid crystal display ("LCD") the common voltage may vary depending on the polarity of the voltage applied to the anode. In the present exemplary embodiment of a display device 1 the switching transistor is an n-type thin film transistor ("TFT") and has the exemplary embodiment of a structure illustrated in FIGS. 1-3, and the driving transistor Q2 is a p-type TFT.

Referring to FIG. 5, the switching transistor has an exemplary embodiment of a structure described with reference to FIGS. 1-3, including two unit transistors Unit TR. Because of the dual unit transistor Unit TR structure, a voltage between a source and a drain of the switching transistor is divided into two, substantially half the voltage going to each of the two unit transistors Unit TR. That is, when a voltage between the source and the drain of the switching transistor is Vsw, a voltage between a source and a drain of the unit transistor Unit TR is ½ Vsw. Thus, a total leakage current between the source and the drain of the switching transistor is reduced or effectively prevented and in particular, a leakage current between the source and the drain of the switching transistor is further reduced by resistance of the low conductivity regions 10e and 10e disposed between the unit transistors Unit TR.

Figure 6:
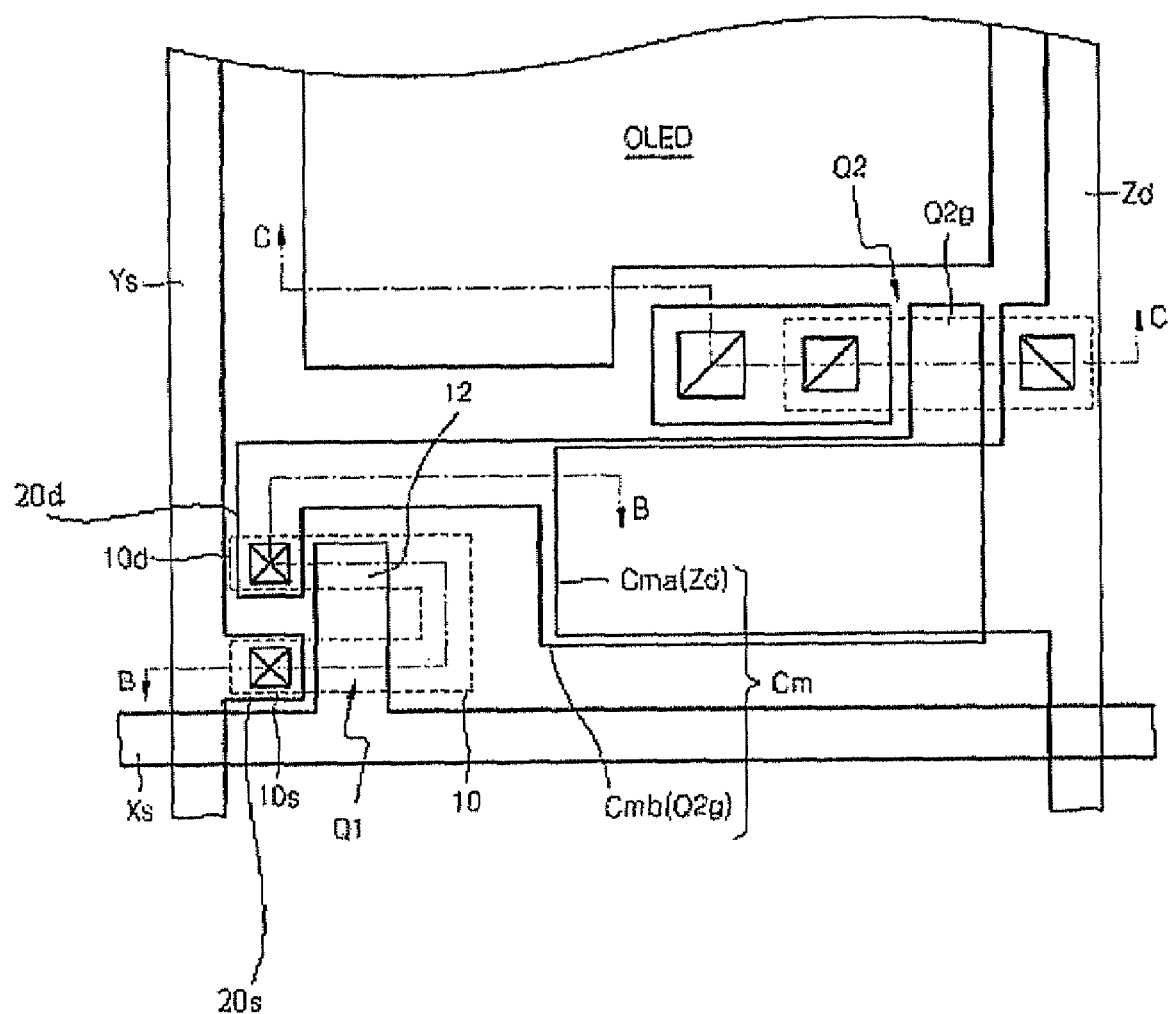
FIG. 6 is a top plan view layout illustrating a portion of the exemplary embodiment of an organic light emitting display illustrated in FIG. 4.

FIG. 6 is a top plan view layout illustrating a portion of the exemplary embodiment of an organic light emitting display illustrated in FIG. 4.

Referring to FIG. 6, which illustrates an exemplary embodiment of a pixel structure, data lines Ys and power supply lines Zd are disposed substantially parallel to one another on the right and left sides of FIG. 6, and gate lines are disposed substantially perpendicular to the data lines Ys and the power supply lines Zs. A switching transistor Q1 is located in a portion of the pixel substantially adjacent to where the gate line Xs and the data line Ys cross each other, and a driving transistor Q2 is disposed near a portion of the pixel in which the gate line Xs and the power supply line Zd cross each other. A memory capacitor Cm is disposed between the switching transistor Q1 and the driving transistor Q2. A first electrode Cma of the memory capacitor Cm extends from the power lines Zd, and a second electrode Cmb of the memory capacitor Cm is formed as a unitary body with a drain electrode $20d$ of the switching transistor Q1 and a gate $Q2g$ of the driving transistor Q2. A gate 12 of the switching transistor Q1 extends from the gate lines Xs.

Figure 7:
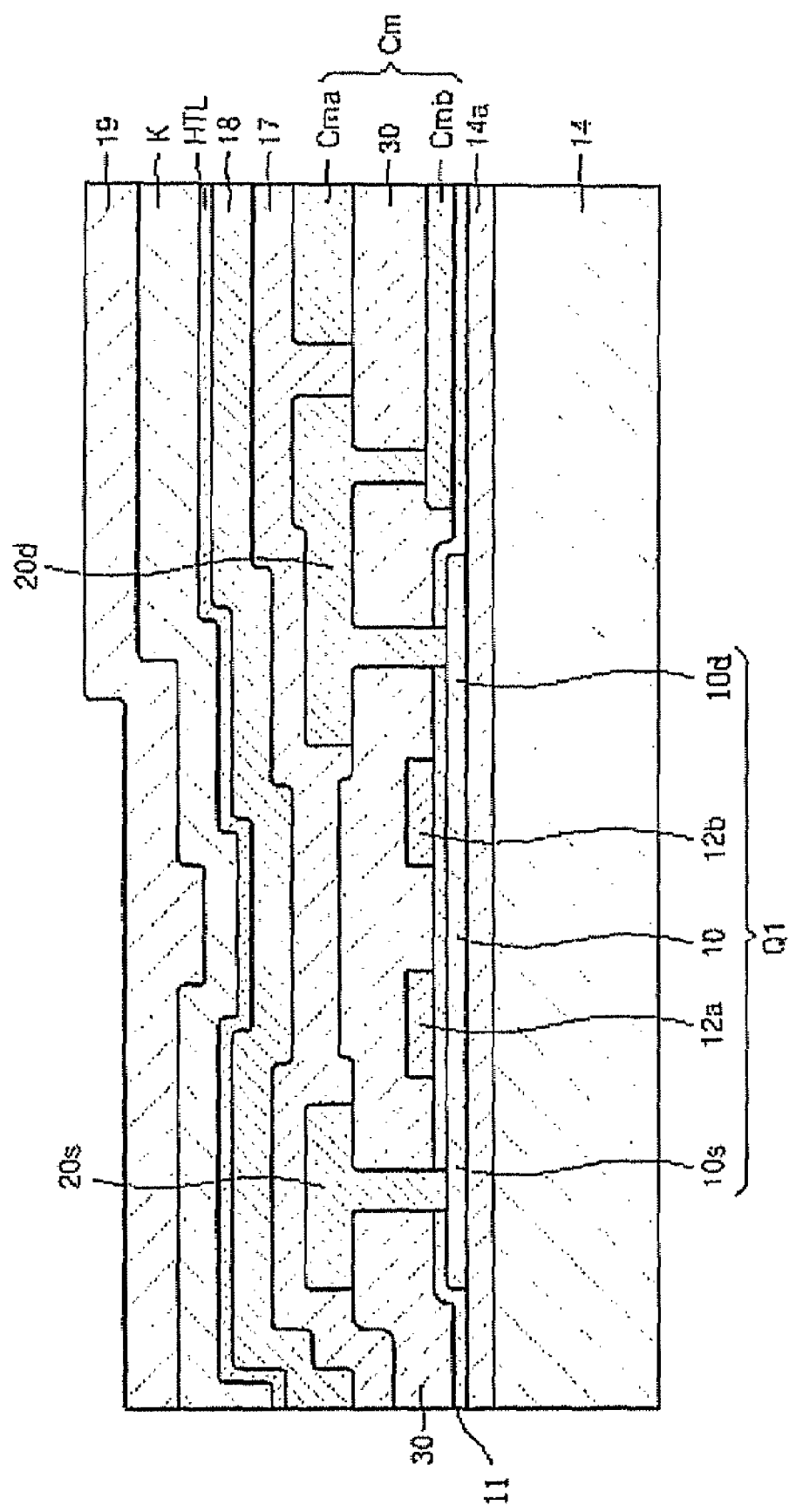
FIG. 7 is a cross-sectional view taken along line B-B of FIG. 6.

FIG. 7 is a cross-sectional view taken along line B-B of FIG. 6.

Referring to FIG. 7 a buffer layer $14a$, exemplary embodiments of which are made of an insulating material, such as silicon dioxide ("$SiO_2$"), is formed on a substrate 14, and a switching transistor Q1 which has a structure according to an exemplary embodiment of the present invention, is formed on the buffer layer $14a$. Alternative exemplary embodiments include configurations wherein the buffer layer $14a$ is omitted. The exemplary embodiment of a switching transistor Q1 has two unit transistors, as described previously. An $SiO_2$ ILD layer 30 is formed on the switching transistor Q1, and a source electrode $20s$ and a drain electrode $20d$ are formed by disposing a metal layer on the $SiO_2$ ILD layer 30. The electrodes $20s$ and $20d$ are electrically connected to the lower source $10s$ and lower drain $10d$ through a contact hole formed in the ILD layer 30. The electrodes $20s$ and $20d$, the second electrode Cmb of the memory capacitor Cm, and the power supply lines Zd may include indium tin oxide ("ITO"). The gates $12a$ and $12a$ of the exemplary embodiment of a switching transistor Q1 extend from the above-described gate lines Xs and in one exemplary embodiment are formed of aluminum or an aluminum alloy.

A dielectric layer of the memory capacitor Cm is a part of the ILD layer 30, and the second electrode Cmb is formed as a unitary body with the gate $Q2g$ of the driving transistor Q2, as described previously. In one exemplary embodiment the second electrode Cmb and the gate $Q2g$ of the driving transistor Q2 are formed of aluminum or an aluminum alloy.

Second and third insulating layers 17 and 18 are formed on the first electrode Cma and the source and drain electrodes $20s$ and $20d$, which are formed as unitary bodies with the data lines Ys and the power supply lines Zd, respectively. A hole transport layer ("HTL"), a common electrode K, which also forms the cathode of an OLED, and a fourth insulating layer 19 are disposed on the second and third insulating layers 17 and 18. The fourth insulating layer 19 is a passivation layer protecting the OLED. Alternative exemplary embodiments include configurations wherein one or more of the abovementioned layers is omitted.

Figure 8:
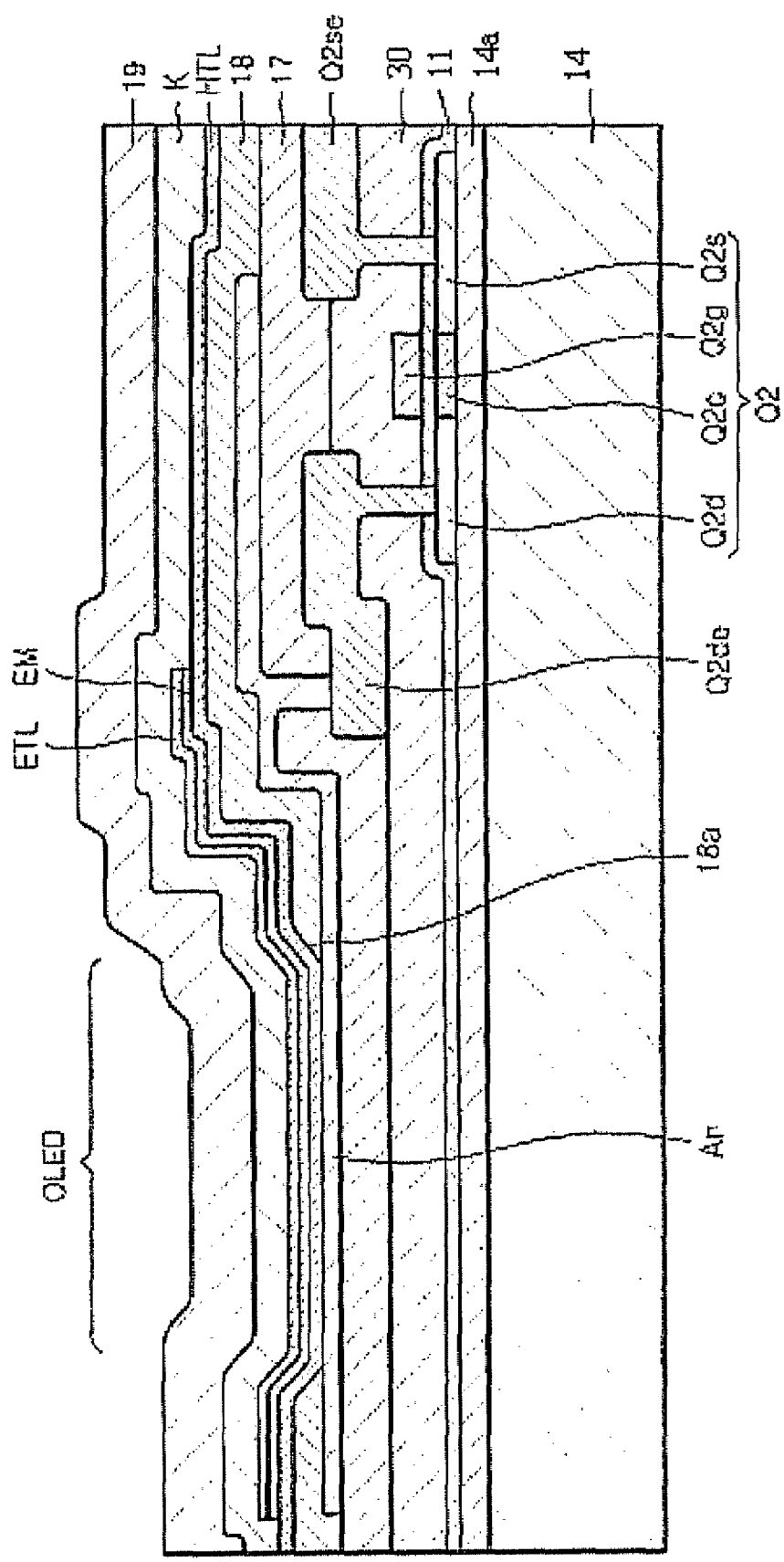
FIG. 8 is a cross-sectional view taken along line C-C of FIG. 6.

FIG. 8 is a cross-sectional view taken along line C-C of FIG. 6 and illustrates the structure of a driving transistor Q2 and an OLED.

Referring to FIG. 8, the buffer layer $14a$ is formed on the substrate 14, and the driving transistor Q2 is formed on the buffer layer $14a$ substantially simultaneously with the previously described switching transistor Q1. In one exemplary embodiment a silicon layer of the driving transistor Q2 is obtained from the same material layer used in fabricating the silicon layer of the switching transistor Qs. In one exemplary embodiment the silicon layer includes polycrystalline silicon. The silicon layer of the driving transistor includes a source $Q2s$, a channel $Q2c$, and a drain $Q2d$. The driving transistor Q2 further includes a gate insulating layer 11, exemplary embodiments of which are formed of $SiO_2$, and a gate $Q2g$ formed on the source $Q2s$, the channel $Q2c$, and the drain $Q2d$. The gate $Q2g$ is formed as a unitary body with the second electrode Cmb of the memory capacitor, as described previously.

An $SiO_2$ ILD layer 30 is formed on the driving transistor Q2, and a source electrode $Q2se$ and a drain electrode $Q2de$ are formed on the $SiO_2$ ILD layer 30. In one exemplary embodiment the source electrode $Q2se$ and the drain electrode $Q2de$ are made of metal, exemplary embodiments of which include aluminum or an aluminum alloy. The electrodes $Q2se$ and $Q2de$ are electrically connected to the lower source $Q2s$ and drain $Q2d$ through a contact hole formed in the ILD layer 30. Second and third insulating layers 17 and 18 are formed on the electrodes $Q2se$ and $Q2de$.

An HTL is disposed on the third insulating layer 18, an emission layer (EM) is disposed in a predetermined region of the HTL, and a common electrode K is disposed on the EM. The above-described fourth insulating layer 19 is formed on the common electrode K. An anode An, also known as a pixel electrode, is connected to the drain electrode $Q2de$ and is located under a lower portion of the OLED. The anode An contacts the HTL through a window $18a$ formed on the third insulating layer $18a$ and is electrically connected to the HTL.

The above-described layout of the exemplary embodiment of an organic light emitting display having the exemplary embodiment of a transistor having the structure according to the present invention is but one exemplary embodiment of the present invention and the present invention is not limited thereto but would include any display including a transistor having the exemplary structure described above.

The exemplary embodiment of an organic light emitting display of the present invention includes an exemplary embodiment of a switching transistor having a low leakage current and thus has features of low power consumption and reduced crosstalk between pixels.

Meanwhile, in the above exemplary embodiment of a transistor, the low conductivity regions are formed without a mask unlike the prior art so that costs for fabricating an exemplary embodiment of a transistor and an exemplary embodiment of a display including the exemplary embodiment of a transistor can be reduced and in particular, yield can be increased.

An exemplary embodiment of a method of fabricating an exemplary embodiment of a polycrystalline silicon transistor according to the present invention will now be described. In the exemplary embodiment of a method of fabricating an exemplary embodiment of a polycrystalline silicon transistor according to the present invention, other elements, e.g., a driving transistor, may be fabricated together when a display is fabricated, and only a method of fabricating one exemplary embodiment of a transistor will be described herein.

Figure 9A:
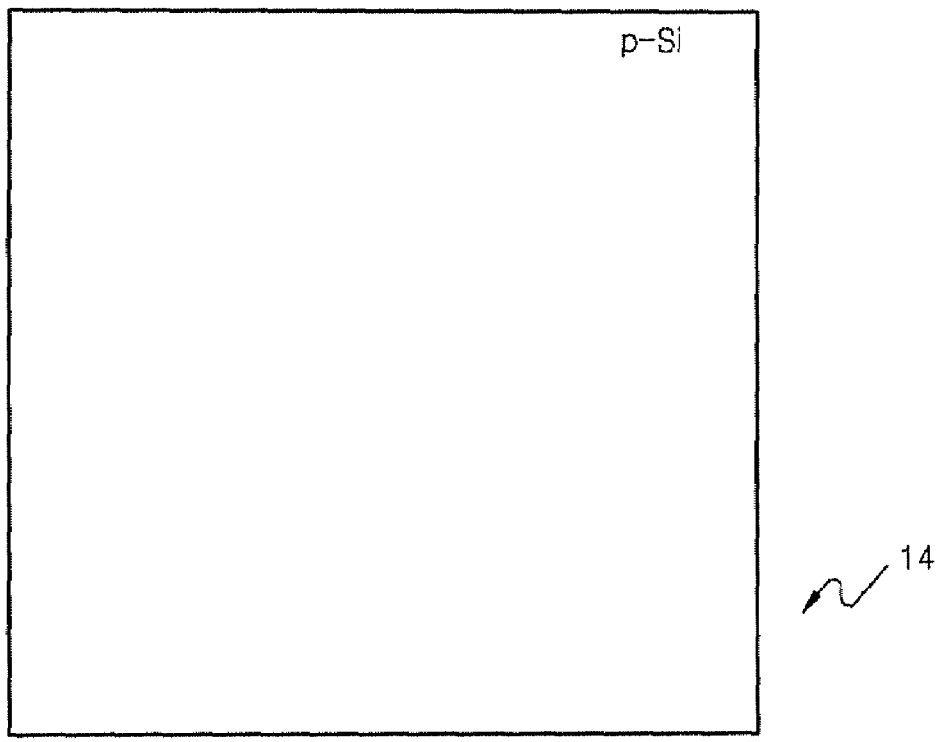
FIGS. 9A through 9H illustrate an exemplary embodiment of a method of fabricating an exemplary embodiment of a transistor according to the present invention.

Referring to FIG. 9A, polycrystalline silicon p-Si is formed on a buffer layer $14a$ which in turn is formed on a glass or plastic substrate 14. The polycrystalline silicon p-Si may be formed using any of several well-known methods. In one exemplary embodiment the polycrystalline silicon p-Si is created by depositing amorphous silicon on the substrate 14 and then crystallizing the amorphous silicon thereon.

Figure 9B:
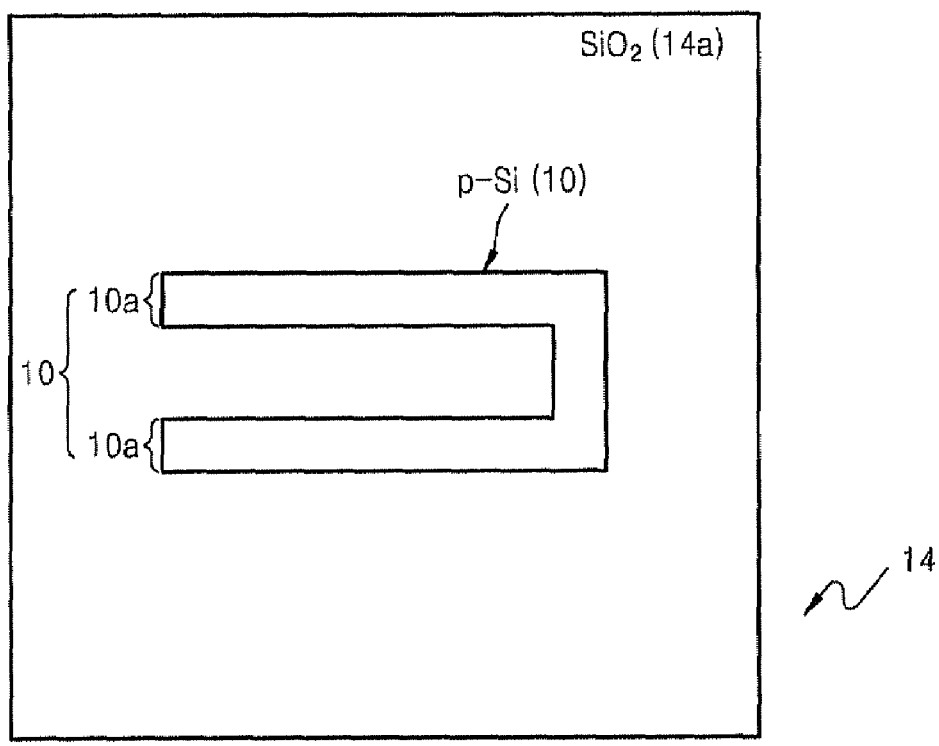

Referring to FIG. 9B, the polycrystalline silicon p-Si is patterned into the U-shaped active layer 10 with two parallel polycrystalline silicon layers $10a$ and $10b$ according to the present invention. The buffer layer $14a$ which is not disposed beneath the U-shaped active layer 10 is exposed during the patterning of the polycrystalline silicon p-Si. Well-known patterning methods, one exemplary embodiment of which is photolithography, are used in the patterning process.

Figure 9C:
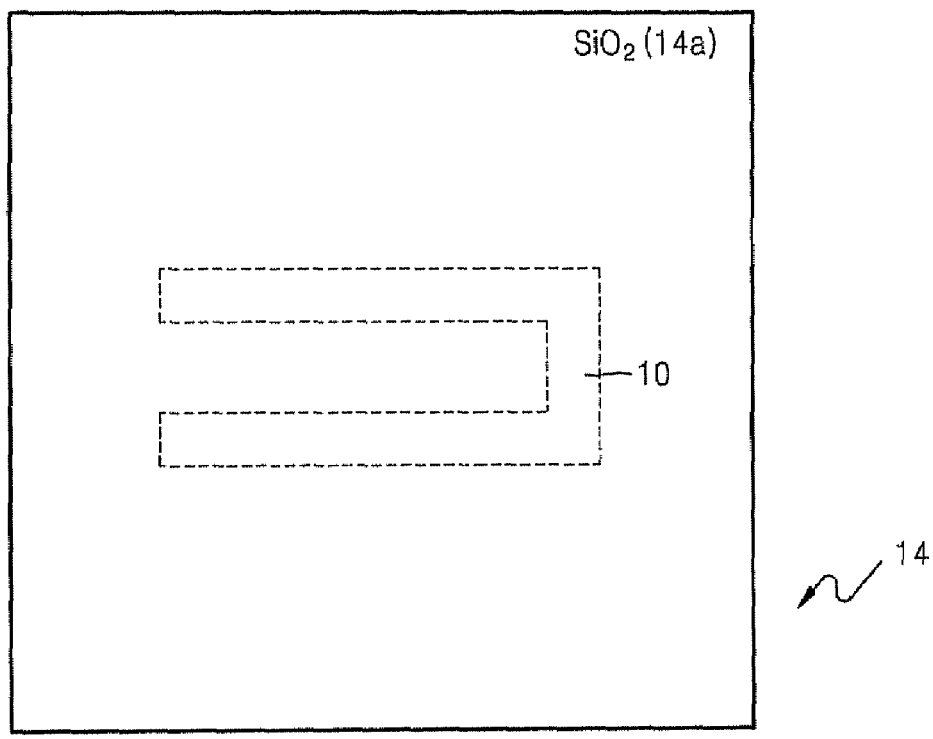

Referring to FIG. 9C, a gate insulating layer 11, exemplary embodiments of Is which are made of $SiO_2$ is deposited on the active layer 10 and the buffer layer 14a. In one exemplary embodiment the gate insulating layer is deposited using chemical vapor deposition ("CVD").

Figure 9D:
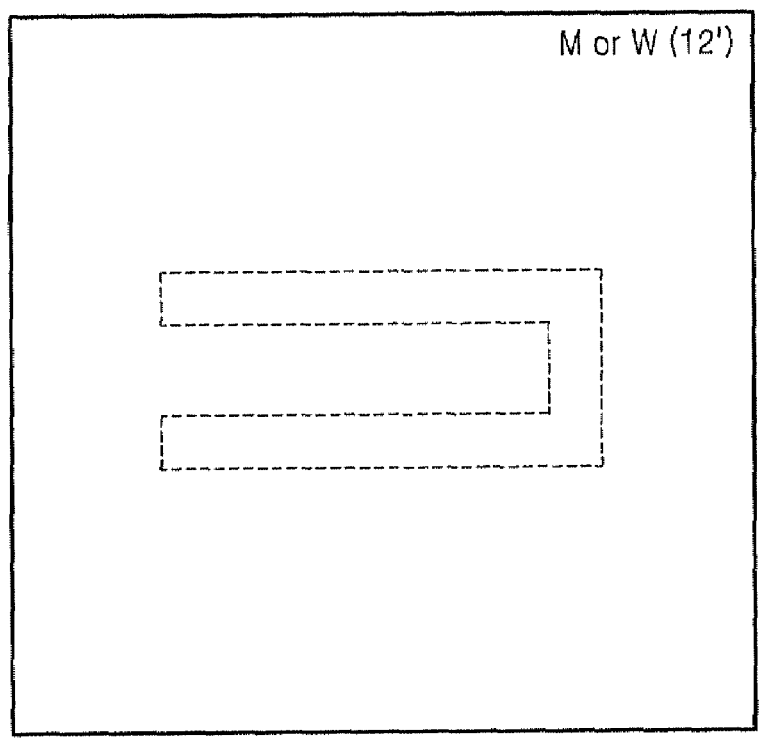

Referring to FIG. 9D, a metallic layer, exemplary embodiments of which include molybdenum M or tungsten W, is deposited on the gate insulating layer 11, thereby forming a gate material layer 12'. Exemplary embodiments include configurations wherein the metallic layer is deposited using deposition or sputtering.

Figure 9E:
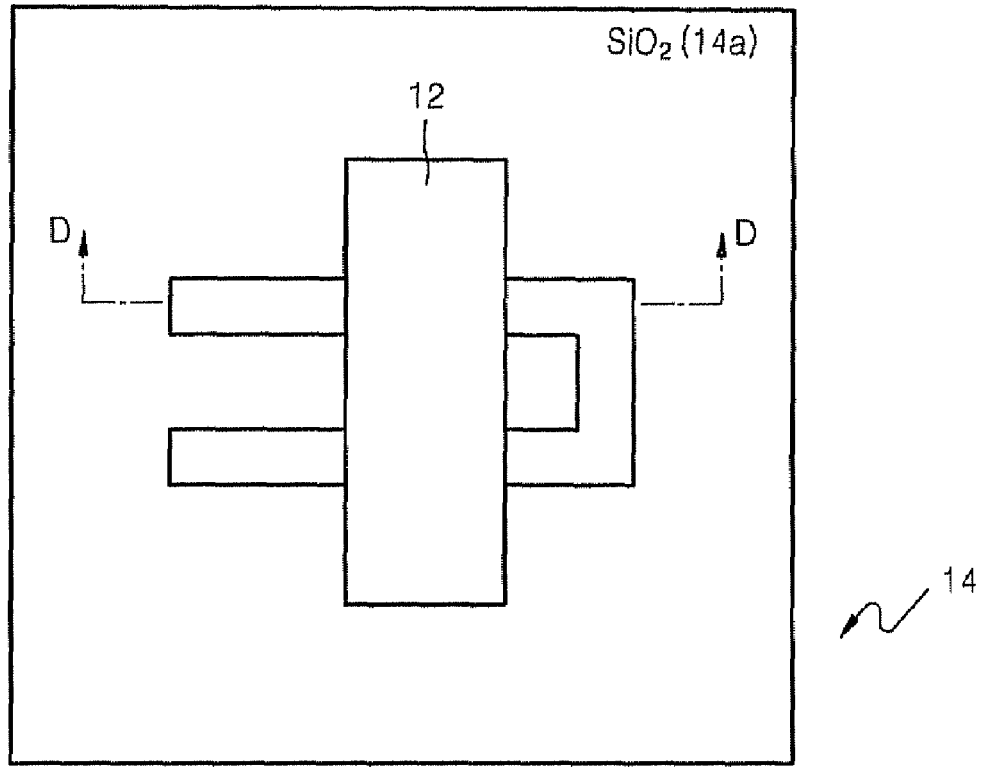

Referring to FIG. 9E, the gate material layer 12' and the gate insulating layer 11 thereunder are patterned and therefore, a gate 12 having a desired shape and the gate insulating layer 11 thereunder are obtained. In one exemplary embodiment a drying etching method using a mask may be used in the patterning process.

Figure 9F:
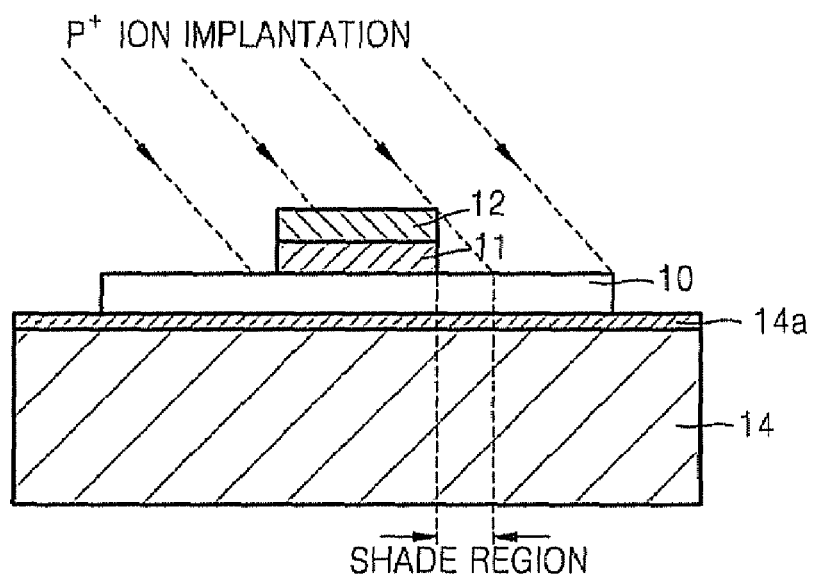

FIG. 9F is a cross-section taken along line D-D of FIG. 9E.

Referring to FIG. 9F, P+ ion implantation, also known as doping, is performed. The direction of ion implantation is inclined at a predetermined angle with respect to the substrate 14. Thus, a shade region is formed at edges of the gate 12 and the gate insulating layer 11. Ion implantation is not performed in the shade region. Thus, a drain junction is offset by a predetermined distance (the width of the shade region) from a lower portion of the gate 12. The offset region is formed in the two polycrystalline silicon layers 10a and 10b of the active layer 10. Subsequently, heat treatment is performed to activate the doped silicon layer. During the heat treatment process, a dopant is lightly diffused from the heavily doped un-shaded region to the shade region and a lightly doped polycrystalline silicon region having low conductivity, e.g., low mobility, is formed in the shaded region.

Figure 9G:
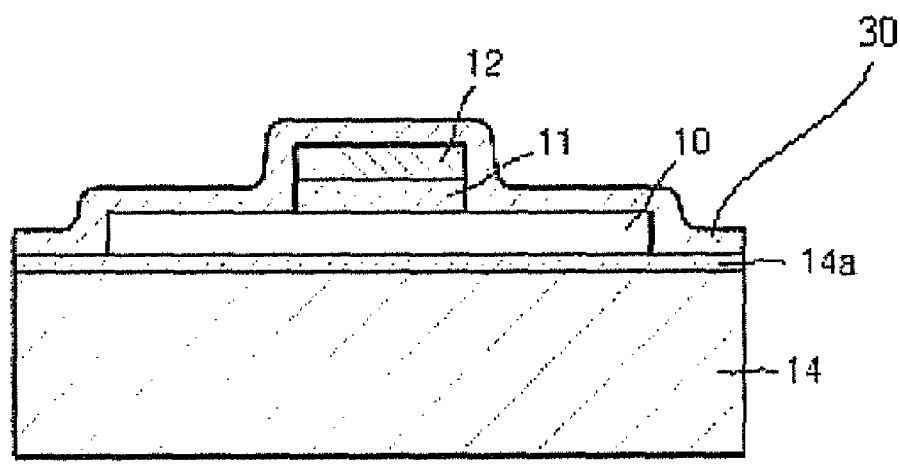
Figure 9H:
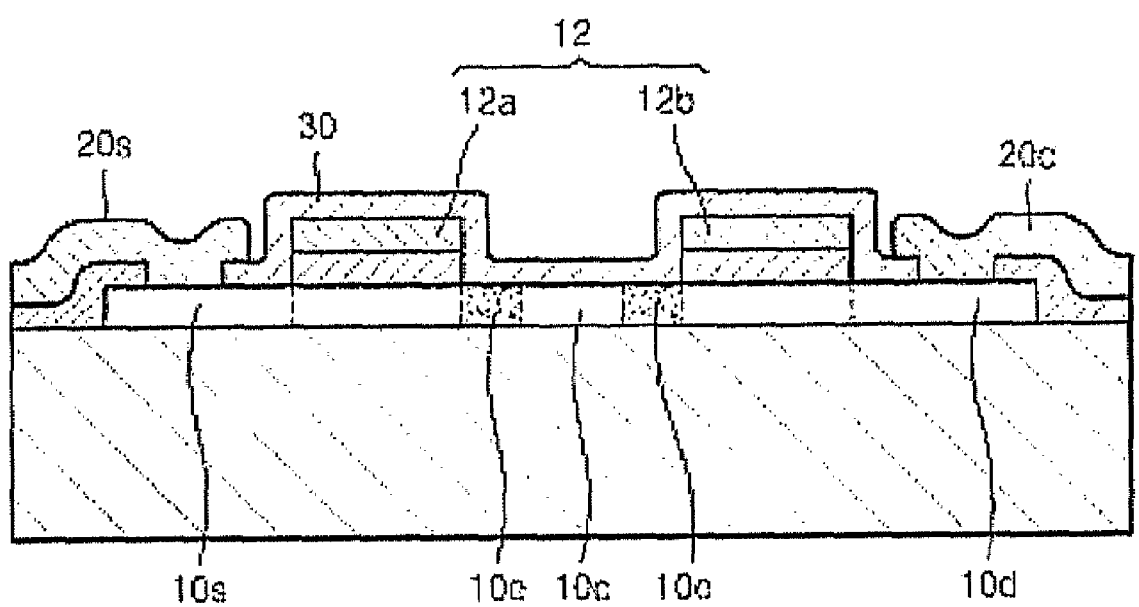

Referring to FIG. 9G, an $SiO_2$ ILD layer 30 is formed on the structure, and a desired exemplary embodiment of a transistor, as illustrated in FIG. 9H, is obtained through subsequent processes of forming a source, a drain, and a contact hole on the ILD layer 30 and depositing and patterning a metallic layer.

The present invention provides a method by which the length of a channel is enlarged in a restricted area and a low mobility region is provided in an offset structure, without the use of a separate mask.

According to the present invention, leakage of a current can be reduced or effectively prevented, and in particular, the offset structure can be formed without a mask such that costs for fabricating an exemplary embodiment of a transistor and an exemplary embodiment of a display including the same are reduced and yield is improved.

The present invention can be applied to a transistor requiring a low leakage current or a display adopting the same, such as an organic light emitting display and an LCD.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A transistor comprising:
    at least two polycrystalline silicon layers disposed substantially parallel to each other, each polycrystalline silicon layer including a channel region and at least two high conductivity regions disposed at opposing sides of the channel region;
    a gate which corresponds to the channel region of the two polycrystalline silicon layers and which crosses the two polycrystalline silicon layers; and
    a gate insulating layer interposed between the gate and the two polycrystalline silicon layers,
    wherein low conductivity regions are disposed adjacent to one edge of the gate and are formed between the channel region and one high conductivity region of each polycrystalline silicon layer.

2. The transistor of claim 1, wherein impurities are doped in the low conductivity regions with a lower concentration than in the high conductivity regions.

3. The transistor of claim 1, wherein the at least two polycrystalline silicon layers are formed as a unitary body.

4. The transistor of claim 3, wherein the low conductivity regions are disposed substantially opposite one another with respect to an axis of symmetry of the transistor.

5. An organic light emitting display comprising:
    a scan line disposed on a substrate;
    a data line disposed substantially perpendicular to the scan line;
    a switching transistor including a source electrode connected to the data line, a gate electrode connected to the scan line, and a drain electrode;
    a driving transistor including a gate electrode connected to the drain electrode of the switching transistor, a source electrode connected to a voltage supply and a drain electrode;
    an organic light emitting diode including a first electrode connected to the drain electrode of the driving transistor and a second electrode connected to a common voltage,
    wherein the switching transistor comprises:
    at least two polycrystalline silicon layers disposed substantially parallel to each other, each polycrystalline silicon layer including a channel region and at least two high conductivity regions disposed at opposing sides of the channel region;
    a gate which corresponds to the channel region of the two polycrystalline silicon layers and which crosses the two polycrystalline silicon layers; and
    a gate insulating layer interposed between the gate and the two polycrystalline silicon layers,
    wherein low conductivity regions are disposed adjacent to one edge of the gate and are formed between the channel region and one high conductivity region of each polycrystalline silicon layer.

6. The organic light emitting display of claim 5, wherein impurities are doped in the low conductivity regions with a lower concentration than in the high conductivity regions.

7. The organic light emitting display of claim 5, wherein the two polycrystalline silicon layers are formed as a unitary body.

8. The organic light emitting display of claim 7, wherein the low conductivity regions are disposed substantially opposite one another with respect to an axis of symmetry of the transistor.

* * * * *